(12) United States Patent
Muza

(10) Patent No.: US 6,275,112 B1
(45) Date of Patent: Aug. 14, 2001

(54) EFFICIENT MICROPHONE BIAS AMPLIFIER WITH HIGH OUTPUT VOLTAGE/CURRENT CAPABILITY AND EXCELLENT PSRR

(75) Inventor: John M. Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/429,542

(22) Filed: Oct. 28, 1999

(51) Int. Cl.[7] ............................................ H03F 3/04
(52) U.S. Cl. ............................ 330/296; 330/85; 330/98
(58) Field of Search .................... 330/85, 98, 99, 330/100, 296

(56) References Cited

U.S. PATENT DOCUMENTS

| | | | |
|---|---|---|---|
| 4,042,889 | * 8/1977 | Baker | 330/207 P |
| 4,459,553 | * 7/1984 | Diller | 330/85 |
| 4,573,021 | * 2/1986 | Widlar | 330/273 |
| 5,025,226 | * 6/1991 | Taylor | 330/277 |

* cited by examiner

Primary Examiner—Robert Pascal
Assistant Examiner—Henry Choe
(74) Attorney, Agent, or Firm—Pedro P. Hernandez; W. James Brady, III; Frederick J. Telecky, Jr.

(57) ABSTRACT

A microphone bias amplifier circuit (30) and method for biasing a microphone with an amplifier circuit. The amplifier circuit (30) has an input stage (34) coupled to an output stage (40). The output stage (40) includes a first transistor (M1) coupled to a feedback loop (32) provides a variable source current (13) to the first transistor (M1) and the output stage output $V_{out}$. The feedback loop (32) includes an amplifier (36) coupled to the first transistor (M1) and a first current source ($I_2$) conducted through a second transistor (M2) and coupled to the amplifier (36). The amplifier (36) controllably drives a third transistor (M3) coupled to a voltage source (AVDD) to generate the variable current source ($I_2$). The gates of the first (M1) and second (M2) transistors are coupled together and driven by the input stage (34). The third transistor (M3) of the feedback loop (32) provides the variable source current ($I_3$) to the first transistor (M1), whereby the current conducted by the first and second transistors ($I_1$, $I_2$) is equal, and the remainder ($I_3$–$I_1$) of the variable source current ($I_3$) is provided to the load of the output stage (40).

16 Claims, 2 Drawing Sheets

continues …

EFFICIENT MICROPHONE BIAS AMPLIFIER WITH HIGH OUTPUT VOLTAGE/CURRENT CAPABILITY AND EXCELLENT PSRR

TECHNICAL FIELD

This invention relates generally to the field of electronic amplifier circuits, and more particularly to a microphone bias amplifier.

BACKGROUND OF THE INVENTION

The recent trend towards the miniaturization of electronic circuits is driven by consumer demand for smaller and light-weight electronic devices such as cellular phones and portable computers. Often, the heaviest component in an electronic device is the battery. Smaller batteries are able to provide less power. As batteries become smaller, integrated circuits (ICs) need lower working voltages and power consumption to prevent the battery from discharging too rapidly.

An amplifier is a linear electronic circuit that may be used to amplify an input signal and provide an output signal that is a magnified replica of the input signal. Amplifiers are used in a variety of electronic circuit design applications. As appliances and circuit designs continue to decrease in size and increase in speed, the need for low power, low noise, current efficient amplifier circuitry increases.

Amplifiers have various performance requirements depending on the function they are used for in a circuit. A microphone bias amplifier should have the following attributes: 1) low noise, 2) high power supply rejection ratio (PSRR); 3) low quiescent current, or rather, low overall current usage; 4) the ability to drive high current levels with an output voltage as close to the power supply rail as possible to obtain a good acoustical gain; 5) low output impedance for rejection of any coupled noise; and 6) the use of as little silicon area as possible.

SUMMARY OF THE INVENTION

The present invention achieves technical advantages as a microphone bias amplifier having low noise, high PSRR, high output current relative to the quiescent current, and high output voltage relative to the power supply rail. The output stage includes a source-follower transistor coupled to a feedback loop that keeps the source-follower transistor current constant. The action of the output stage is very linear and works well in applications having a high voltage swing, relative to the power supply.

In one embodiment, disclosed is an output stage for an amplifier circuit, including a first transistor coupled to a feedback loop. The feedback loop includes an amplifier coupled to the first transistor, and a current source powering a second transistor and coupled to the amplifier. The amplifier drives a third transistor powered by a voltage source. The first and second transistors are coupled together. The third transistor of the feedback loop provides the entire source current for the first transistor.

In another embodiment, disclosed is a microphone bias amplifier circuit, including an input stage coupled to an output stage. The output stage includes a first transistor coupled to a first feedback loop. The first feedback loop includes a first amplifier coupled to the first transistor, and a first current source powering a second transistor and coupled to the first amplifier. The first amplifier drives a third transistor powered by a voltage source. The first and second transistors are coupled together, and the third transistor provides the entire source current for the first transistor.

Further disclosed is a method of biasing a microphone with an amplifier circuit having an input stage coupled to an output stage. The output stage has a feedback loop coupled to a first transistor. The method includes the step of controlling the current through the first transistor with the output stage feedback loop.

Advantages of the present invention are an amplifier circuit having a low quiescent current or overall current usage, having the ability to drive high current levels relative to the quiescent current. The output voltage may approach, or be approximately equal to, the voltage of the power supply. The circuit has a low output impedance for rejection of coupled noise and uses very little silicon area. Furthermore, the output stage has a high transconductance compared to circuits of the prior art, so large capacitive loads may be driven at low current levels while maintaining stability.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

In a microphone circuit, ideally, a microphone would be coupled directly to the power supply, so the microphone may benefit from the highest current and voltage possible. However, this is not possible because noise from the power supply would go through the microphone and create noise on the voice channel of the cellular phone or other electronic device at the output. To prevent noise from the power supply being present at the microphone and increase PSRR, a microphone bias amplifier circuit is typically used.

Figure 1:
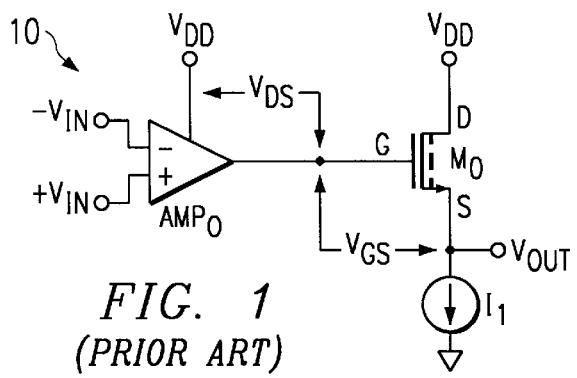
FIG. 1 illustrates a source-follower amplifier circuit of the prior art having an NMOS transistor at the output, where the output voltage $V_{out}$ cannot reach a high voltage due to the $V_{gs}$ of $M_0$.

In the past, conventional amplifiers have been used for microphone bias amplifier circuits to varying degrees of success, but an efficient amplifier design specific for a microphone bias application having a high output voltage relative to the power supply rail, high output current relative to the quiescent current, and good PSRR is not available in the prior art. A typical amplifier circuit of the prior art is shown generally at 10 in FIG. 1. An amplifier $Amp_0$ is coupled to and drives a transistor $M_0$, where transistor $M_0$ is an NMOS field effect transistor (FET). The output voltage $V_{out}$ of the circuit 10 is generated at the source of the transistor $M_0$. The output $V_{out}$ cannot reach the fall supply voltage $V_{DD}$ and is limited primarily by the gate-source voltage $V_{gs}$ of transistor $M_0$. The approximate maximum voltage the output voltage $V_{out}$ can reach is $(V_{DD}-V_{gs}-V_{DS})$.

Figure 2:
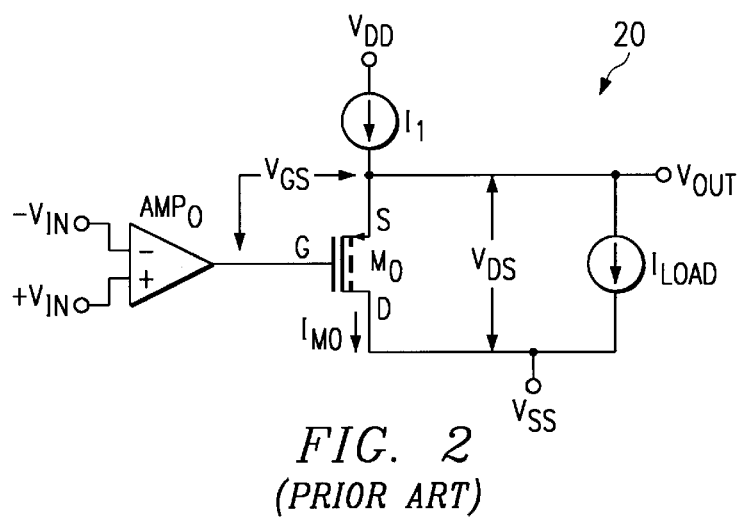
FIG. 2 illustrates a source-follower bias amplifier circuit of the prior art having a PMOS transistor at the output.

For a microphone bias amplifier circuit, low output impedance is desired, which typically involves using a source-follower output stage, e.g. class AB amplifier, such as the circuit shown generally at 20 in FIG. 2. Rather than using an NMOS transistor as in the circuit 10 of FIG. 1, a PMOS transistor is used for the transistor $M_0$ so the output voltage $V_{out}$ is higher, closer to the positive voltage rail $V_{dd}$. However, the efficiency of the half source-follower circuit 20 is poor because current $I_1$, must be the maximum amount regardless of current draw from the load $I_{load}$, which in telecom applications typically varies from zero to 1.3 mA to support up to two external electret microphones, for example. The circuit 20 requires a certain amount of current $I_1$ from the power supply $V_{dd}$ and also requires a wide voltage range to work properly.

In a source-follower amplifier circuit such as the one shown in FIG. 2, the output $V_{out}$ tracks the input at $V_{in}$. If the input $V_{in}$ goes high, the output $V_{out}$ also goes high. FIG. 2 is a class A type design which requires $I_1$ to be set to the maximum load current $I_{load}$ plus the current necessary to bias transistor $M_0$ correctly. Even if $I_{load}$ is removed, current $I_1$, is still set to its maximum level, thus using 1–2 mA of current unnecessarily. Also, when using a conventional 2-stage common-source amplifier $Amp_o$ with a PMOS transistor $M_0$ as the output device to obtain high output voltage and good efficiency, this creates a relatively high output impedance and poor PSRR. A large amount of semiconductor real estate is required for the compensation capacitor (not shown) coupled to the output. Another disadvantage of the prior art circuit 20 is that the output impedance is approximately equal to the output transconductance $g_m$ of the transistor $M_0$. A higher current $I_1$ is needed to accommodate the higher transconductance $g_m$.

What is needed in the art is a more efficient microphone bias amplifier having good PSRR, high output current relative to the quiescent current, and high output voltage relative to the power supply rail. The more current that flows through a microphone bias amplifier, the greater the sensitivity. In a telecom application such as a wireless phone, higher current results in a better acoustic to electrical gain of the voice signal.

Figure 3:
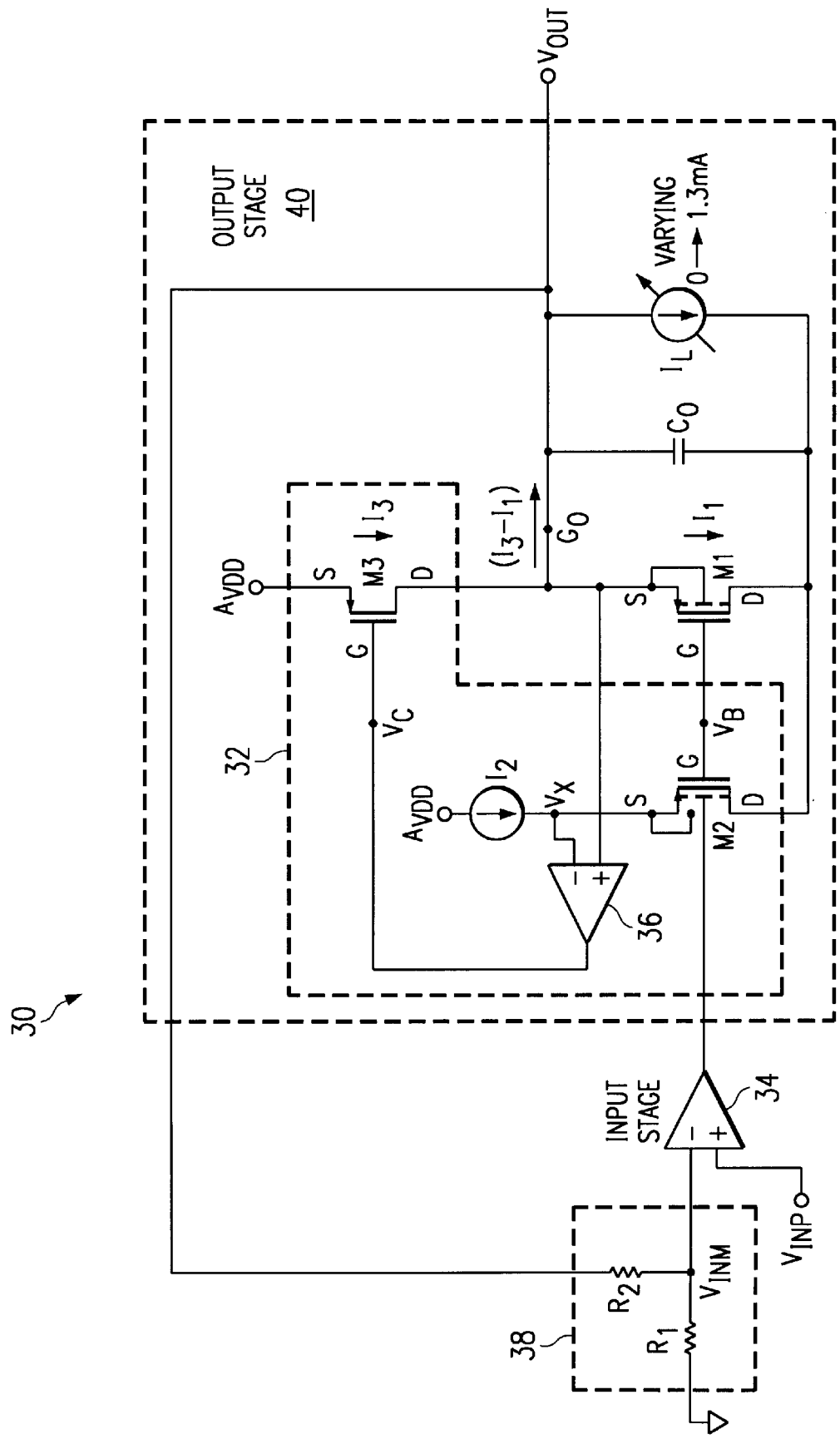
FIG. 3 shows a schematic diagram of a bias amplifier circuit according to the present invention.

A block diagram of the microphone bias amplifier of the present invention is shown generally at 30 in FIG. 3. The amplifier circuit 30 comprises a low noise input stage 34 coupled to an output stage 40 including transistor $M_1$ and having a feedback loop 32 to provide excellent PSRR. The circuit 30 has a high voltage swing, low impedance, high current-driving output stage 40. The input stage 34 comprises an amplifier having two input terminals, $V_{inm}$ and $V_{inp}$. The amplifier 34 is coupled to a global feedback loop 38 coupled to $V_{out}$ via resistor $R_1$, with resistor $R_2$ coupled to $R_1$ and ground.

The output stage 40 comprises a signal amplifying transistor M1 conducting current $I_1$, coupled to the internal feedback loop 32. The feedback loop 32 includes a transistor M2 conducting current $I_2$ having a gate coupled to node $V_B$ and to the gate of transistor M1. The transistor M2 is driven by the output terminal of amplifier 34 of the input stage. The drain of transistor M2 is coupled to a return voltage AVSS. The source of transistor M2 is coupled to and receives fixed current source 12 and an inverting input of feedback amplifier 36 at node $V_x$. The feedback amplifier 36 is coupled at the other input, preferably the positive non-inverting input terminal, to the output terminal $V_{out}$, the source of transistor M1, and the drain of transistor M3. The source of transistor M3 is coupled to the voltage source AVDD. The feedback amplifier 36 controllably drives the gate of transistor M3 to provide a variable current 13 from source AVDD to the common node of transistor $M_1$ and the output $V_{out}$, with the current provided to the load at $V_{out}$ being the difference of $I_3 - I_1$.

At first glance the amplifier 34 may appear to be a preamplifier stage driving a source-follower PMOS output stage. However, transistor M3 advantageously acts as a variable current source, providing all the sourcing current needed for output transistor M1. The feedback loop 32 controls the sourcing current $I_1$ through transistor M1 to be the same as the current 12 conducting through transistor M2. Therefore, output transistor M1 always conducts a current $I_1$ from AVDD equal to source current $I_2$, regardless of the loading at terminal $V_{out}$.

The feedback loop 32 of the present invention creates a unity gain source-follower amplifier circuit 30. In this biasing scheme, the main amplifier 34 drives the gate of transistor M1, and also the gate of transistor M2. If the output $V_{out}$ goes high, node $V_x$ goes high, which causes node $V_c$ to go low, responsively increasing the current $I_3$ conducting through transistor $M_1$ and the current $(I_3-I_1)$ to the load. The output stage 40 of the present invention comprises a source-follower transistor $M_1$ coupled to a feedback loop 32 that keeps the source-follower transistor $M_1$ current $I_1$ constant to a fixed given value. The operation of the output stage 40 is very linear and works well in applications having a high voltage swing relative to the power supply.

Assuming that the current 13 through transistor M3 is less than its absolute limit, the feedback loop 32 forces the voltage gain at $V_B$ to $V_{out}=1$, or as good as the feedback loop 32 can make it. Advantageously, little current is consumed by the circuit 30 when there is no load at $V_{out}$. Also, the present invention can drive large capacitors such as $C_0$ placed at $V_{out}$ in some systems. Preferably, amplifiers 34 and 36 are single stage, low power amplifier designs.

If the amplifier 36 voltage gain is reasonably large, which is preferable, the feedback loop 32 through M2, amplifier 36, and M3 to $V_{out}$ has a gain approximately equal to 1. To illustrate this, an initial power-up sequence will be described. Initially, $V_c = A_{VDD}$, $i_{R2} = 0_{R1} = 0$, $i_L = 0$ $V_{out} = 0$ V, $V_B = A_{VDD}$, $V_x = 0$ V and $V_{INM} = 0$ V. $A_{VDD}$ is the analog power supply voltage and may be 2.7 V, for example. Upon power up, since $V_{INM}$ and $V_{INP} > 0$ ($V_{INM}$ at time t=0+) the input stage amplifier 34 keeps the voltage at node $V_B$ railed high. Since current $I_2$ is forced through transistor M2, node $V_x$ rises from 0 V. Now the voltage at node $V_x$ is greater than the output voltage $V_{out}$ (which is still a very low potential) so amplifier 36 forces node $V_c$ to drop. This allows transistor M3 to provide current through the global feedback loop of $R_2$ and $R_1$, which causes node $V_{INM}$ and $V_{out}$ to begin to rise. This continues until $V_{INM}$ and $V_{INP}$ get close enough in voltage for the input stage amplifier 34 to bring the voltage at node $V_B$ down, which brings the voltage at node $V_x$ down due to the source-follower action of transistor M2. Now the voltages at nodes $V_x$ and $V_{out}$ converge, and the voltage at nodes $V_{INM}$ and $V_{INP}$ converge. Therefore, a steady-state is reached when the global feedback loop 38 forces $V_{out}$ to be what it needs to be to keep the input terminals of the input stage 34 together, and the internal feedback loop 32 forces node $V_x = V_{out}$, which in turn always keeps the currents through transistors M1 and M2 equal, or $I_1 = I_2$. No current is wasted in the output stage 40 because $M_3$ only supplies the current $(I_3 - I_1)$ needed by the load at $V_{out}$. Very high output voltage levels relative to power supply $A_{VDD}$ and/or high current levels $(I_3 - I_1)$ may be generated with the present invention, and the quiescent current is very well controlled. The input stage is essentially decoupled from the output stage 40 so that the circuit 30 may be specialized for high PSRR and noise performance.

Figure 4:
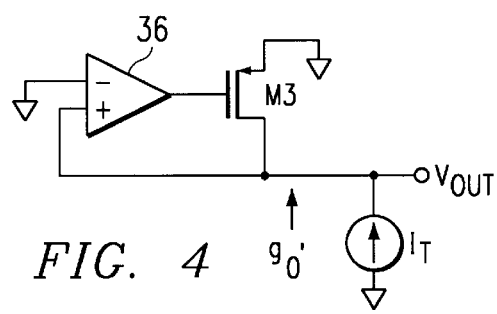
FIGS. 4 and 5 illustrate models for analysis of output impedance of the amplifier circuit.
Figure 5:
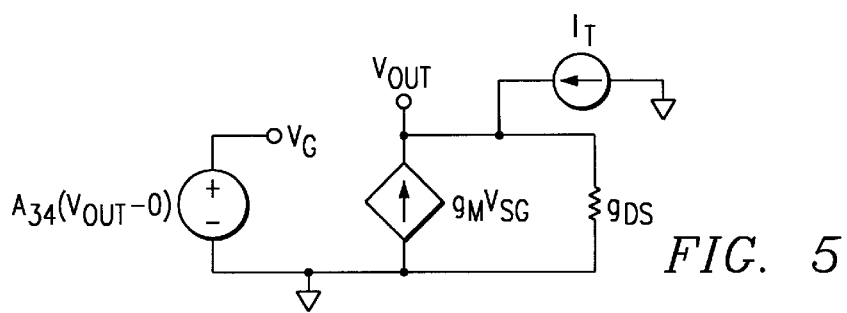

FIGS. 4 and 5 illustrate circuit models used in the following analysis of the amplifier circuit 30 in calculating the output impedance $G_0$. Using Kirchoff's Current Law (KCL) at $V_{out}$:

$$g_m(0-A_{34} V_{out})-V_{out}g_{dsM3}=-i_t \quad \text{Equation 1}$$

$$I/V=g_o, =g_{mM3}A_{34}+g_{dsM3} \quad \text{Equation 2}$$

The "$g_{dsM3}$" portion of Equation 2 is negligible compared to the other term; therefore, the total output impedance $G_0$ of circuit 30 is:

$$G_0=g_{mM3}A_{34}+g_{mM2} \quad \text{Equation 3}$$

The above analysis explains how a high conductance $G_0$ at node $V_{out}$ is achievable on the output stage, in accordance with the present invention. The $g_m$ of the output stage is essentially the product of the gm of transistor M3 and amplifier 36. Amplifier 36 may have a very high gain, on the order of 1000, for example, because it drives a high impedance load. Therefore, the circuit 30 may be very high gain and while requiring very low current. Furthermore, the circuit 30 remains stable when driving very large capacitive loads, represented by capacitor $C_0$. This is advantageous because with large load capacitors, if the $g_m$ of the output stage is too small, then the design is typically unstable in a 2-stage architecture.

Circuit modeling results conclude the amplifier circuit 30 may be built in a very small area of silicon, for example, 50,000 square microns. The amplifier circuit consumes less than 100 $\mu A$ when driving a 100 pF load capacitor, assuming no current draw $I_{load}$ from the load. This is accomplished because the output impedance is approximately equal to $g_{mM3}A_{34}$ as shown above. Testing of the circuit 30 revealed good noise density and transient responses under heavy loading. The circuit 30 proved stable in lab tests, with the PSRR at 50 kHz being 65 dB under maximum 1.24 mA current draw load under worse case conditions.

The present invention achieves technical advantages as a microphone bias amplifier having low noise, high PSRR, high output current relative to the quiescent current, and high output voltage relative to the power supply rail. The circuit 30 has a low quiescent current or overall current usage, and the ability to drive high current levels, e.g., 1 mA or greater. The output voltage $V_{out}$ may be kept close to the power supply rail $A_{VDD}$, e.g., 2.6 V on a 2.7 V supply. The amplifier circuit 30 has a low output impedance for rejection of any type of coupled noise and uses very little silicon area. Furthermore, the output stage has a high transconductance $g_m$ compared to the $g_m$ of the prior art, so a large capacitor $C_0$ may be driven at low current levels while maintaining stability. A plurality of amplifiers 30 may be used in a circuit with a minimal amount of current and voltage range being required.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, other transistors driven by a power-down signal, not shown, may be coupled to transistors M1 and M3 to ensure that no current flows when the amplifier circuit 30 is powered down. Transistors M1, M2 and M3 of the present invention preferably comprise PMOS MOSFETS, but may also comprise other transistors such as bipolar, for example. The amplifier circuit of the present invention may be implemented in a wide variety of applications, such telecommunications applications, mobile devices and systems, laptops and personal computers, mixed signal and analog devices, and any low power electrical applications, in general.

What is claimed is:

1. An output stage having an output for an amplifier circuit having an input stage comprising:

a first transistor coupled to said output stage output;

a feedback loop coupled to said first transistor providing a variable current to said first transistor and to said output stage output, the feedback loop further comprises a first current source controllably coupled to said first transistor and a fixed second current source, wherein current conducted by said first transistor is substantially equal to said fixed second current source, the difference between said variable current and said current conducted by said first transistor is provided to said output stage output;

said feedback loop further comprises a second transistor conducting said fixed second current, said first and second transistors both being controlled by the input stage;

and said current conducted by said first transistor is stable into high capacitive loads at said output stage output.

2. An output stage for an amplifier circuit, comprising:

a first transistor;

a feedback loop comprising an amplifier coupled to said first transistor;

a second transistor coupled to said amplifier and to said first transistor;

a current source conducting through said second transistor;

a third transistor coupled to a voltage source providing a source current;

said amplifier driving said third transistor and the third transistor provides said source current to said first transistor and to an output of said output stage; and said feedback loop is adapted to control the current conducted through said first transistor such that the current conducted by the first transistor is equal to the current conducted by the second transistor.

3. An output stage for an amplifier circuit, comprising:

a first transistor; and a feedback loop comprising an amplifier coupled to said first transistor;

a second transistor coupled to said amplifier and to said first transistor;

a current source conducting through said second transistor;

a third transistor coupled to a voltage source providing a source current;

said amplifier driving said third transistor and the third transistor provides said source current to said first transistor and to an output of said output stage; and said amplifier comprises a negative input terminal, a positive input terminal and an output terminal, said first transistor comprises a gate, source and drain, said second transistor comprises a gate, source and drain, said third transistor comprises a gate, source and drain, wherein said first and second transistor drains are coupled to a return voltage, said first and second transistor gates are coupled together, said second transistor source is coupled to said current source and said amplifier negative input terminal, said first transistor source is coupled to said amplifier positive input terminal and said third transistor drain, said amplifier output terminal is coupled to said third transistor gate, and said third transistor source is coupled to said voltage source.

4. An output stage for an amplifier circuit, comprising:

a first transistor;

a feedback loop comprising an amplifier coupled to said first transistor;

a second transistor coupled to said amplifier and to said first transistor;

a current source conducting through said second transistor;

a third transistor coupled to a voltage source providing a source current; said amplifier driving said third transistor and the third transistor provides said source current to said first transistor and to an output of said output stage; and said amplifier comprises a negative input terminal, a positive input terminal and an output terminal, said first transistor comprises a gate, source and drain, said second transistor comprises a gate, source and drain, said third transistor comprises a gate, source and drain, wherein said first and second transistor drains are coupled to a return voltage, said first and second transistor gates are coupled together, said second transistor source is coupled to said current source and said amplifier negative input terminal, said first transistor source is coupled to said amplifier positive input terminal and said third transistor drain, said amplifier output terminal is coupled to said third transistor gate, and said third transistor source is coupled to said voltage source and an output voltage is generated at said first transistor source.

5. The output stage of claim 4 wherein said first and second transistor gates are coupled to an input stage providing an input voltage, wherein said output voltage is substantially equal to said input voltage.

6. A microphone bias amplifier circuit, comprising:

an input stage having an input node;

an output stage-coupled to said input stage and providing an output voltage, said output stage comprising a first transistor coupled to a first feedback loop;

said first feedback loop comprising a first amplifier coupled to said first transistor;

a second transistor coupled to said first amplifier and to said first transistor;

a current source conducting through said second transistor;

a third transistor coupled to a voltage source providing a source current;

said first amplifier driving said third transistor, and the third transistor provides said source current to said first transistor and to an output of said output stage; and said first feedback loop is adapted to control the current conducted through said first transistor such that the current conducted by the first transistor is equal to the current conducted by the second transistor.

7. A microphone bias amplifier circuit, comprising:

an input stage having an input node;

an output stage coupled to said input stage and providing an output voltage, said output stage comprising a first transistor coupled to a first feedback loop;

said first feedback loop comprising a first amplifier coupled to said first transistor;

a second transistor coupled to said first amplifier and to said first transistor;

a current source conducting through said second transistor;

a third transistor coupled to a voltage source providing a source current;

said first amplifier driving said third transistor, and the third transistor provides said source current to said first transistor and to an output of said output stage;

said first feedback loop is adapted to control the current conducted through said first transistor, and said input stage is adapted to receive an input voltage from said input stage, wherein said first transistor comprises a gate, source and drain, wherein said third transistor comprises a gate, source and drain, wherein said output voltage is generated at said first transistor source, wherein said output voltage is substantially equal to said input voltage.

8. The amplifier circuit of claim 7, wherein said first amplifier comprises a negative input terminal, a positive input terminal and an output terminal, wherein said second transistor comprises a gate, source and drain, wherein said first and second transistor drains are coupled to a return voltage, said first and second transistor gates are coupled together, said second transistor source is coupled to said first current source and said first amplifier negative input terminal, said first transistor source is coupled to said first amplifier positive input terminal and said third transistor drain, said first amplifier output terminal is coupled to said third transistor gate, and said third transistor source is coupled to said voltage source.

9. A microphone bias amplifier circuit, comprising:

an input stage having an input node;

an output stage coupled to said input stage and providing an output voltage;

said output stage comprising a first transistor coupled to a first feedback loop;

said first feedback loop comprising a first amplifier coupled to said first transistor;

a second transistor coupled to said first amplifier and to said first transistor;

a current source conducting through said second transistor;

a third transistor coupled to a voltage source providing a source current;

said first amplifier driving said third transistor, and the third transistor provides said source current to said first transistor and to an output of said output stage;

said first feedback loop is adapted to control the current conducted through said first transistor, and said input stage comprises a second amplifier, and said second amplifier drives said first and second transistors.

10. A microphone bias amplifier circuit, comprising:

an input stage having an input node;

an output stage coupled to said input stage and providing an output voltage;

said output stage comprising a first transistor coupled to a first feedback loop;

said first feedback loop comprising a first amplifier coupled to said first transistor;

a second transistor coupled to said first amplifier and to said first transistor;

a current source conducting through said second transistor;

a third transistor coupled to a voltage source providing a source current;

said first amplifier driving said third transistor, and the third transistor provides said source current to said first transistor and to an output of said output stage; said first feedback loop is adapted to control the current conducted through said first transistor, said input stage comprises a second amplifier, and said second amplifier drives said first and second transistors; and a global feedback loop coupled between said output voltage and said input stage input node.

11. A microphone bias amplifier circuit, comprising:

an input stage having an input node; and an output stage coupled to said input stage and providing an output voltage, said output stage comprising a first transistor coupled to a first feedback loop, said first feedback loop comprising a first amplifier coupled to said first transistor, a second transistor coupled to said first amplifier, a current source conducting through said second transistor, a third transistor coupled to a voltage source providing a source current, said first amplifier driving said third transistor, said first and second transistors being coupled together, wherein the third transistor provides said source current to said first transistor and to an output of said output stage;

a global feedback loop coupled between said output voltage and said input stage input node; and said global feedback loop further comprises a first resistor, and a second resistor coupled between said second amplifier and ground.

12. The circuit of claim 4 wherein said voltage source is less than or equal to 2.7 volts and capacitive loads of 100 pF or greater may be driven by said output stage while said amplifier circuit consumes 100 $\mu$A or less.

13. A method of biasing a microphone with an amplifier circuit having an output and including an input stage coupled to an output stage, said output stage having a feedback loop coupled to a first transistor in said output stage, and said feedback loop includes an amplifier coupled to said first transistor, a first current source conducting through a second transistor and coupled to said amplifier, said amplifier driving a third transistor conducting a source current from a voltage source, said first and second transistors being coupled together, and said input stage is adapted to receive an input voltage, wherein said first transistor and third transistors each include a gate, source and drain, said method comprises the steps of:

controlling a current conducted through said first transistor with said output stage feedback loop;

providing the source current from said third transistor to the first transistor and to said amplifier circuit output; and generating an output voltage at said first transistor source and said amplifier circuit output, wherein said output voltage is substantially equal to said input voltage.

14. A method of biasing a microphone with an amplifier circuit having an output and including an input stage coupled to an output stage, said output stage having a feedback loop coupled to a first transistor in said output stage, and said feedback loop comprises an amplifier coupled to said first transistor, a first current source conducting through a second transistor and coupled to said amplifier, said amplifier driving a third transistor conducting a source current from a voltage source, said first and second transistors being coupled together, and said input stage is adapted to receive an input voltage, wherein said first and third transistors each comprise a gate, source and drain, and the source current conducted through said first transistor equals the current conducted through said second transistor, said method comprising the steps of:

controlling a current conducted through said first transistor with said output stage feedback loop;

providing the source current from said third transistor to the first transistor and to said amplifier circuit output; and generating an output voltage at said first transistor source and said amplifier circuit output, wherein said output voltage is substantially equal to said input voltage.

15. The method of claim 13, further comprising the step of: said output stage driving a capacitive load of 100 pF or greater.

16. The amplifier circuit of claim 6, further comprising a global feedback loop coupled between the output voltage and the input stage input node.

* * * * *